(12) United States Patent
Chen

(10) Patent No.: US 12,532,653 B2
(45) Date of Patent: Jan. 20, 2026

(54) METHOD OF REDUCING SPLICING SPACING OF OLED DISPLAY PANEL SPLICING UNIT

(71) Applicant: HUA YANG Precision Machinery Co., Ltd, Tainan (TW)

(72) Inventor: Yu-Jen Chen, Taichung (TW)

(73) Assignee: HUA YANG PRECISION MACHINERY CO., LTD, Tainan (TW)

(*) Notice: Subject to any disclaimer, the term of this patent is extended or adjusted under 35 U.S.C. 154(b) by 455 days.

(21) Appl. No.: 18/336,668

(22) Filed: Jun. 16, 2023

(65) Prior Publication Data

US 2024/0389445 A1 Nov. 21, 2024

(30) Foreign Application Priority Data

May 16, 2023 (TW) .................................. 112118195

(51) Int. Cl.
*H10K 71/00* (2023.01)
*H10K 59/12* (2023.01)
*H10K 59/131* (2023.01)

(52) U.S. Cl.
CPC ....... *H10K 71/851* (2023.02); *H10K 59/1201* (2023.02); *H10K 59/131* (2023.02)

(58) Field of Classification Search
CPC . H10K 71/851; H10K 59/131; H10K 59/1201
USPC .................. 257/40, 59, 91, 99, 100; 438/99
See application file for complete search history.

(56) References Cited

U.S. PATENT DOCUMENTS

| | | | |
|---|---|---|---|
| 8,962,357 B2* | 2/2015 | Park | H10K 59/8723 438/22 |
| 11,101,454 B2* | 8/2021 | Jung | H10K 71/421 |
| 11,890,851 B2* | 2/2024 | Park | B32B 38/105 |
| 2003/0080678 A1* | 5/2003 | Kim | H10K 50/841 313/504 |
| 2009/0039760 A1* | 2/2009 | Kwon | H10K 59/8722 445/25 |
| 2009/0206734 A1* | 8/2009 | Kim | H10K 59/131 313/504 |
| 2012/0161618 A1* | 6/2012 | Kwon | H10K 59/80516 313/506 |
| 2015/0189717 A1* | 7/2015 | Kuranaga | H10K 59/8722 313/511 |
| 2016/0306460 A1* | 10/2016 | Lee | H10K 77/10 |
| 2018/0040837 A1* | 2/2018 | Seo | H10K 77/111 |

(Continued)

*Primary Examiner* — Eric W Jones
(74) *Attorney, Agent, or Firm* — MUNCY, GEISSLER, OLDS & LOWE, P.C.

(57) ABSTRACT

A method of reducing splicing spacing of an OLED display panel splicing unit includes the steps of: A) preparing: preparing a semi-finished splicing unit having a substrate, the substrate having thereon a plurality of wires, a plurality of light-emitting components, a plurality of edge connecting pads, at least one baffle and a transparent gum; B) cutting: cutting off a portion of the substrate, with the portion cut off at least lying outside the at least one baffle, leaving intact at least the plurality of wires, the plurality of light-emitting components, the plurality of edge connecting pads and the transparent gum on the substrate; and C) partial degumming: removing a portion of the transparent gum to allow the plurality of edge connecting pads to be partially exposed and not covered with the transparent gum.

10 Claims, 17 Drawing Sheets

(56) References Cited

U.S. PATENT DOCUMENTS

| | | | | |
|---|---|---|---|---|
| 2019/0326336 A1* | 10/2019 | Xi | ........................ | H01L 25/167 |
| 2022/0134729 A1* | 5/2022 | Park | .................... | B32B 38/1825 |
| | | | | 156/701 |
| 2023/0165054 A1* | 5/2023 | Lee | ...................... | H10K 71/851 |
| | | | | 257/40 |
| 2023/0180582 A1* | 6/2023 | Pu | ...................... | H10K 59/8731 |
| | | | | 257/40 |
| 2023/0225167 A1* | 7/2023 | Kwon | .................... | H10K 59/18 |
| 2023/0363242 A1* | 11/2023 | Kim | .................... | H10K 59/873 |
| 2024/0113265 A1* | 4/2024 | Yuan | .................... | H01L 25/167 |
| 2024/0194838 A1* | 6/2024 | Li | ........................ | H10H 20/01 |
| 2024/0355970 A1* | 10/2024 | Zhou | .................... | H10H 20/853 |
| 2025/0072178 A1* | 2/2025 | Wang | .................... | H10H 29/142 |

\* cited by examiner

METHOD OF REDUCING SPLICING SPACING OF OLED DISPLAY PANEL SPLICING UNIT

BACKGROUND OF THE INVENTION

1. Technical Field

The present disclosure relates to display panel splicing technology, and more particularly to a method of reducing splicing spacing of an OLED display panel splicing unit.

2. Description of Related Art

Known demand for splicing display panels can be exemplified by organic light-emitting diode (OLED) display panels. Display panel splicing is aimed at splicing multiple small display panels functioning as splicing units to form a large-sized panel to achieve an advantage, i.e., quick splicing-based production of large-sized panels is feasible because of the ease of manufacturing small display panels.

Existing known OLED display panel splicing technology uses a splicing unit that includes a plurality of wires and a plurality of light-emitting components provided on a board and two baffles provided at an edge of the board coated with transparent gum, with the two baffles being adapted to restrain the transparent gum, such that connecting terminals at the edge are not covered with the transparent gum, thereby allowing the connecting terminals to be joined to another splicing unit in order to form a large-sized display panel.

However, the aforesaid technology has a drawback: the two baffles and uncovered connecting terminals take up a large area that is around hundreds of m in width and free of the plurality of light-emitting components within the width, and thus a non-displaying zone as wide as one pixel approximately is formed; as a result, it makes a large-sized spliced display panel to be looked like as having several strips of non-displaying pixels. In short, the prior art fails to achieve seamless splicing and thus still has room for improvement.

BRIEF SUMMARY OF THE INVENTION

It is an objective of the disclosure to provide a method of reducing splicing spacing of an organic light-emitting diode (OLED) display panel splicing unit to dispense with conventional baffles and related components other than the baffle and thus greatly reduce the width of a non-displaying zone, thereby achieving seamless splicing in image display.

To achieve the above and other objectives, the disclosure provides a method of reducing splicing spacing of an OLED display panel splicing unit, comprising the steps of: A) preparing: preparing a semi-finished splicing unit having a substrate, with the substrate being rectangular and having an upper surface, a lower surface and four sides, the upper surface having thereon a plurality of wires, a plurality of light-emitting components, a plurality of edge connecting pads, at least one baffle and a transparent gum, the plurality of light-emitting components being connected to the plurality of wires, the plurality of edge connecting pads being connected to the plurality of wires, and the transparent gum being cured, transparent, and adapted to cover at least a portion of the plurality of edge connecting pads and the plurality of light-emitting components, wherein the at least one baffle is positioned proximate to an edge of the substrate, spaced apart from the edge of the substrate by a predetermined distance, and adapted to be in contact with the transparent gum; B) cutting: cutting off a portion of the substrate, wherein the portion cut off at least lies outside the at least one baffle, leaving intact at least the plurality of wires, the plurality of light-emitting components, the plurality of edge connecting pads and the transparent gum on the substrate; and C) partial degumming: removing a portion of the transparent gum to allow the plurality of edge connecting pads to be partially exposed and not covered with the transparent gum, so as to attain a finished splicing unit.

The aforesaid steps of the method of the disclosure are effective in dispensing with conventional baffles on the substrate and related components other than the baffle and thus greatly reduce the width of a non-displaying zone, thereby achieving seamless splicing in image display.

DETAILED DESCRIPTION OF THE INVENTION

The technical features of the disclosure are hereunder illustrated with preferred embodiments, depicted with accompanying drawings, and described below.

Figure 1:
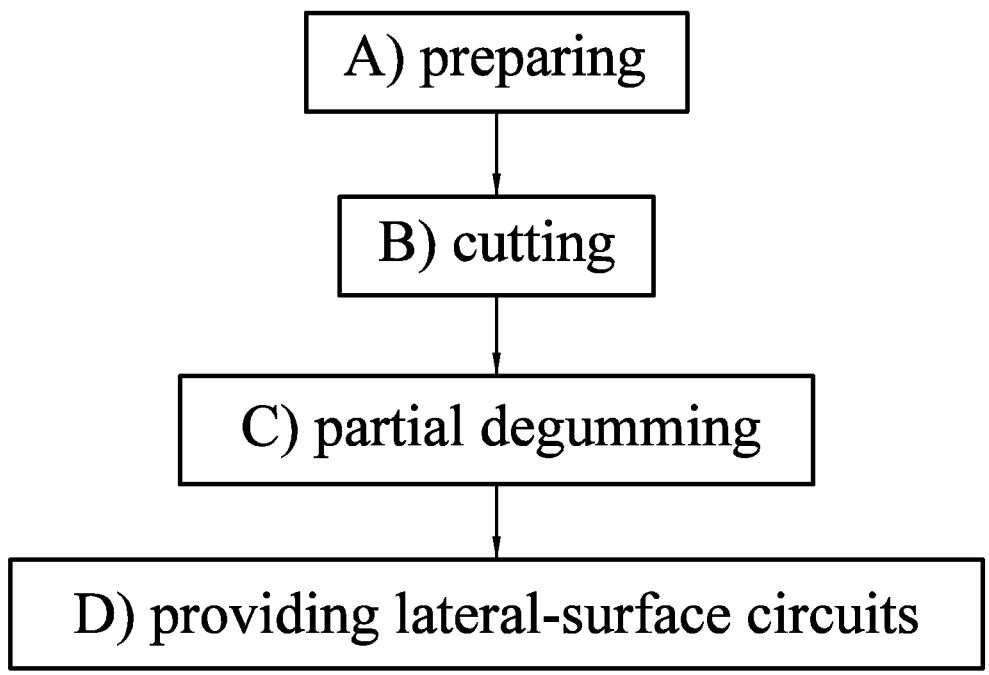
FIG. 1 is a schematic view of a process flow of a method of reducing splicing spacing of an OLED display panel splicing unit according to the first preferred embodiment of the disclosure.
Figure 2:
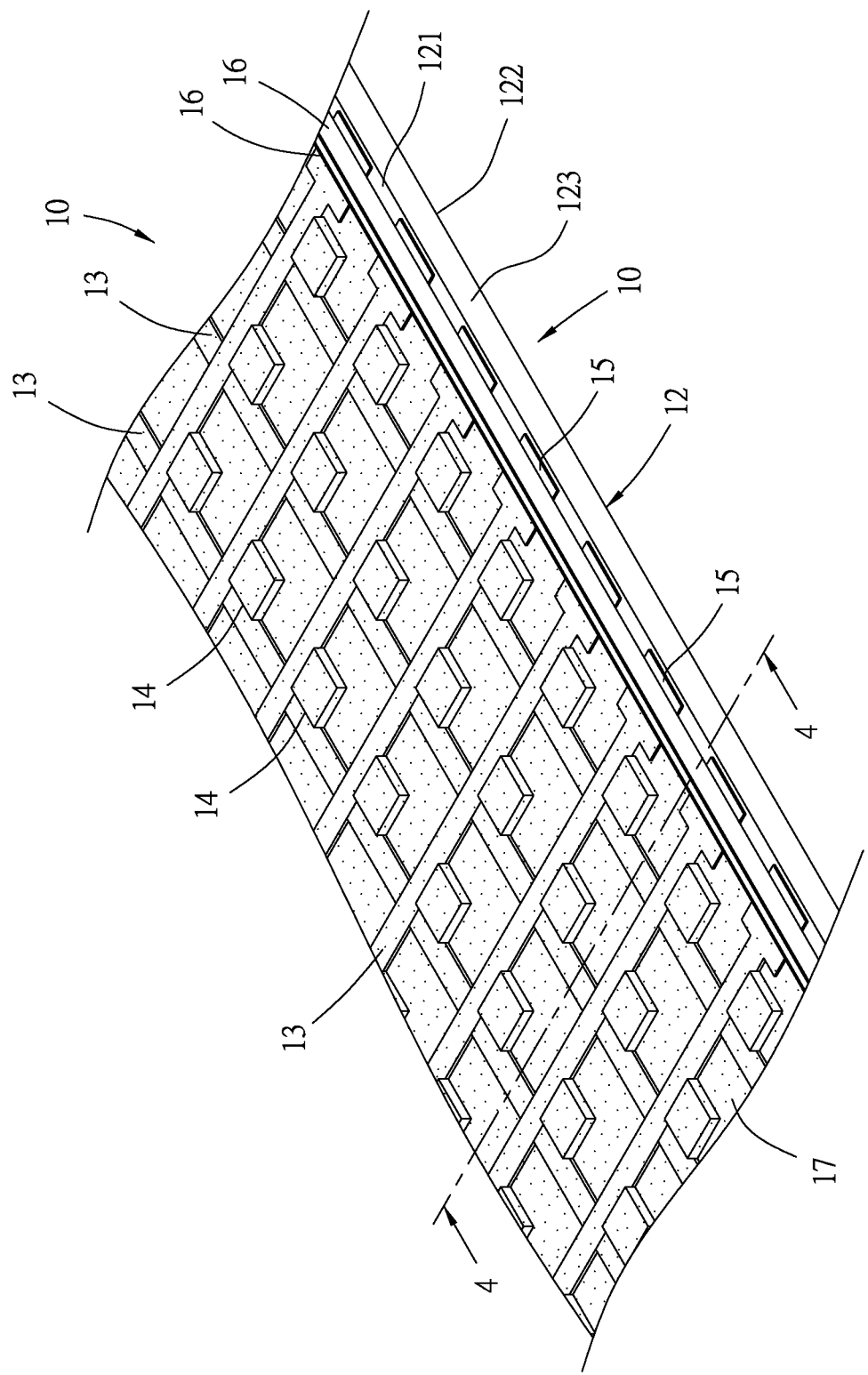
FIG. 2 is a perspective view of a portion of a semi-finished splicing unit according to the first preferred embodiment of the disclosure.
Figure 3:
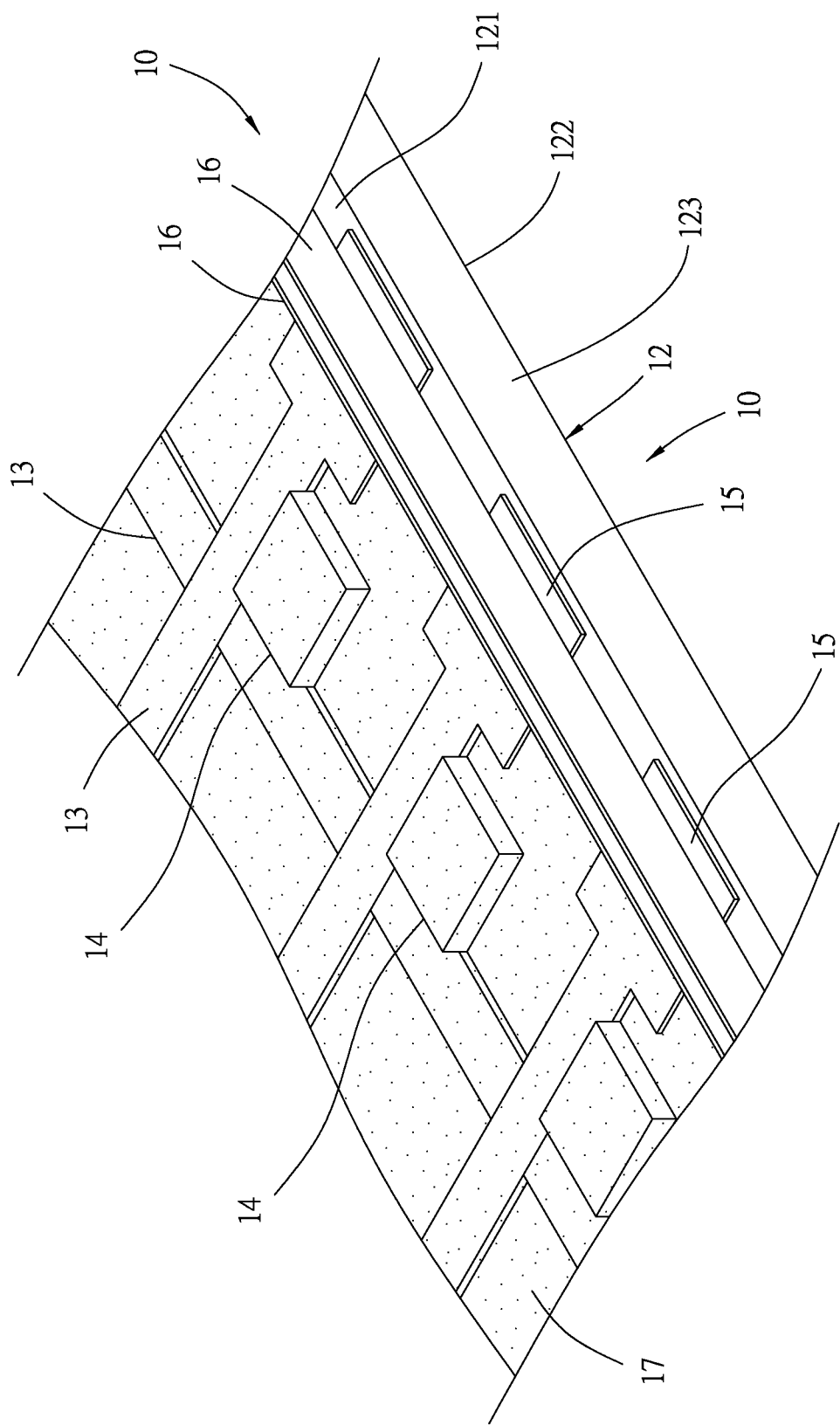
FIG. 3 is a partial enlarged view of FIG. 2.
Figure 4:
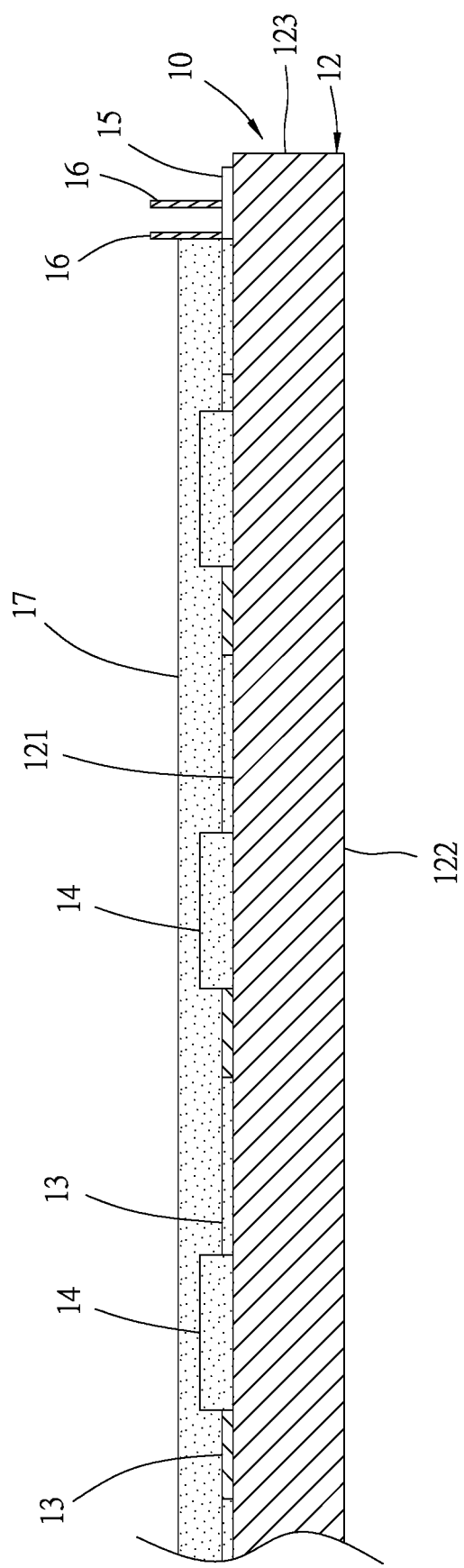
FIG. 4 is a cross-sectional view of the semi-finished splicing unit taken along line 4-4 of FIG. 2.

Referring to FIG. 1 through FIG. 8, the first preferred embodiment of the disclosure provides a method of reducing splicing spacing of an organic light-emitting diode (OLED) display panel splicing unit, comprising the steps as follows:

A) Preparing: as shown in FIG. 2 through FIG. 4, preparing a semi-finished splicing unit 10. The semi-finished splicing unit 10 has a substrate 12. The substrate 12 is rectangular and has an upper surface 121, a lower surface 122 and four sides 123. A plurality of wires 13, a plurality of light-emitting components 14, a plurality of edge connecting pads 15, two baffles 16 and a transparent gum 17 are disposed on the upper surface 121. The plurality of light-emitting components 14 in the first embodiment are organic light-emitting diodes (OLEDs), for exemplary sake, and connect to the plurality of wires 13. The plurality of edge connecting pads 15 are located at an edge of the substrate 12 and connected to the plurality of wires 13. In practice, the plurality of edge connecting pads 15 are usually located at two adjacent edges of the substrate 12 to facilitate matrical splicing; however, in the first embodiment, the plurality of edge connecting pads 15 are located at only one edge of the substrate 12 for exemplary sake. Furthermore, each edge connecting pad 15 and the corresponding wire 13 connected thereto are integrally formed for exemplary sake to facilitate the concurrent formation of the plurality of edge connecting pads 15 and the plurality of wires 13; however, in practice, each edge connecting pad 15 and the corresponding wire 13 connected thereto are formed separately instead of integrally. The two baffles 16 are disposed on the plurality of edge connecting pads 15, and one of the baffles 16 is in contact with the transparent gum 17. The transparent gum 17 is not only cured and thus transparent but also covers a portion of the plurality of edge connecting pads 15 and the plurality of light-emitting components 14.

Figure 5:
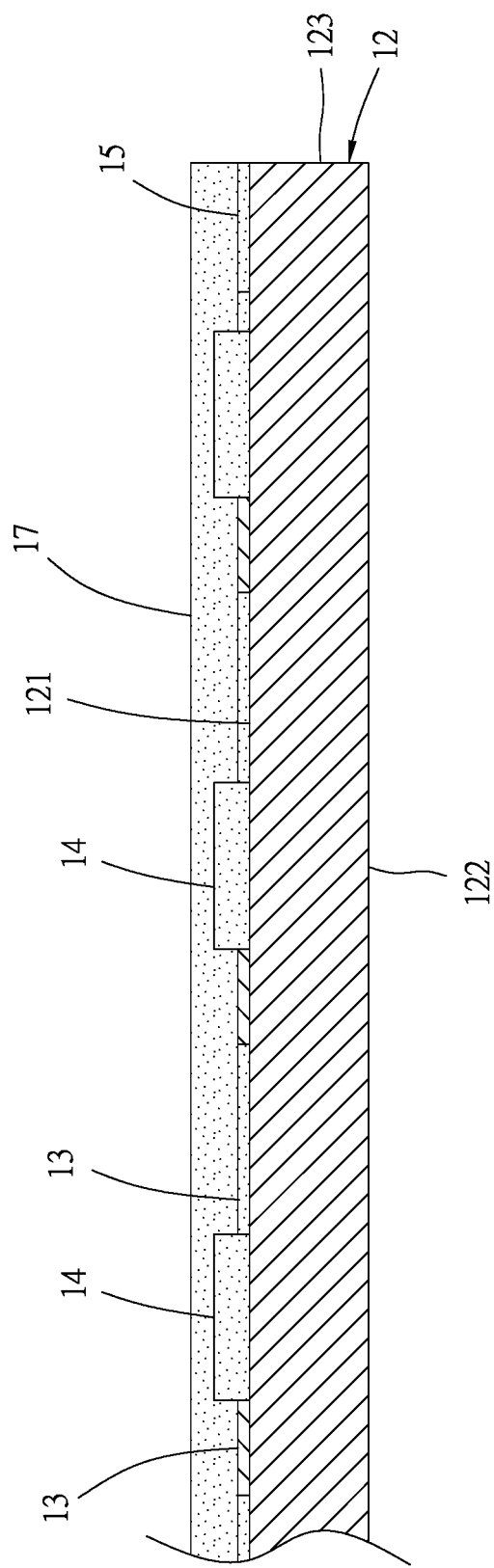
FIG. 5 is a schematic view of how the method works according to the first preferred embodiment of the disclosure.

B) Cutting: as shown in FIG. 5, a portion of the substrate 12 is cut off when the portion of the substrate 12 extends outward from the two baffles 16. The portion cut off includes the two baffles 16, a portion of the plurality of edge connecting pads 15, and a portion of the substrate 12, leaving intact the plurality of wires 13, the plurality of light-emitting components 14, a portion of the plurality of edge connecting pads 15 and the transparent gum 17 on the substrate 12. The cutting process is carried out with an existing known means, such as a knife or laser. Furthermore, the cutting process is followed by a polishing process performed on the side 123 of the substrate 12, wherein the side 123 of the substrate 12 results from the cutting process. The polishing process is aimed at rendering the side 123 flat to facilitate the subsequent provision of the lateral-surface circuits.

Figure 6:
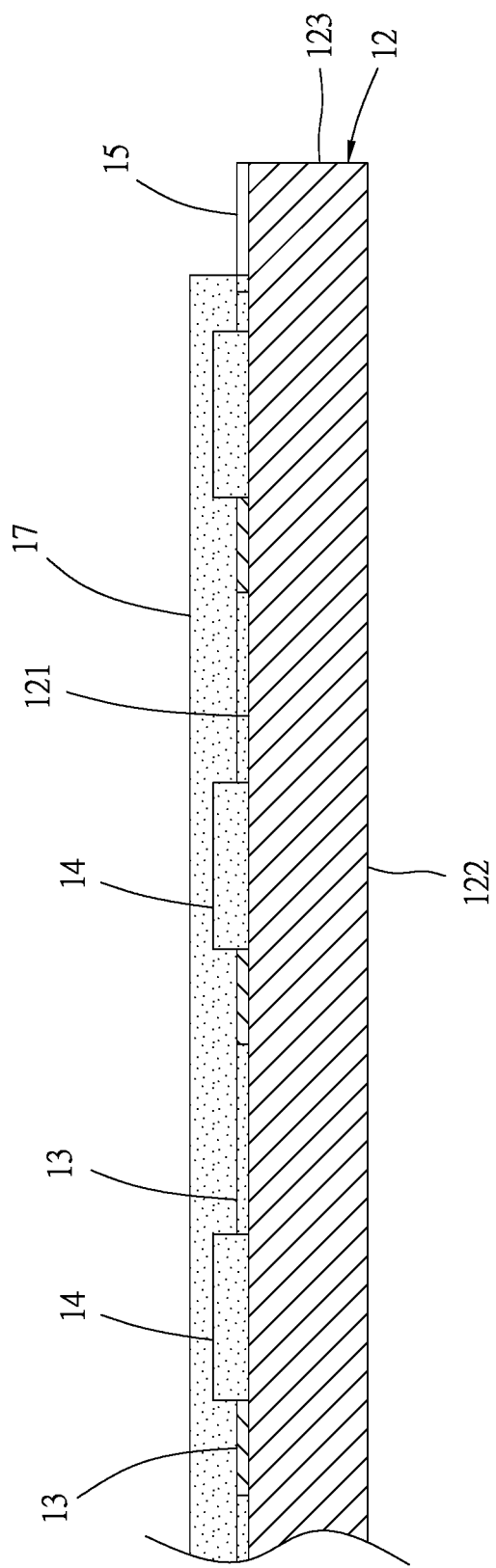
FIG. 6 is another schematic view of how the method works according to the first preferred embodiment of the disclosure.

C) Partial degumming: as shown in FIG. 6, a portion of the transparent gum 17 is removed to allow the plurality of edge connecting pads 15 to be partially exposed and not covered with the transparent gum 17. The degumming process is carried out with an existing known means, such as chemical etching or laser radiation.

Figure 7:
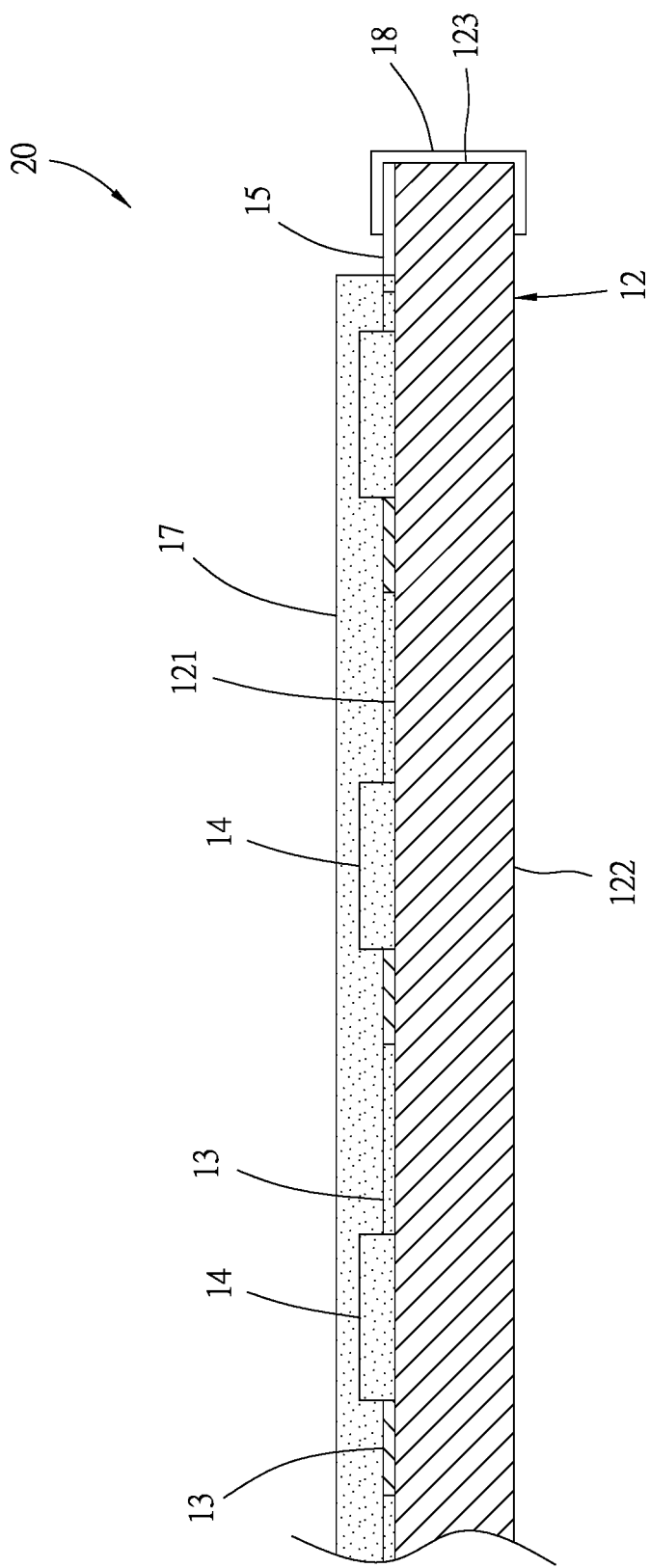
FIG. 7 is a cross-sectional view of a finished splicing unit according to the first preferred embodiment of the disclosure.
Figure 8:
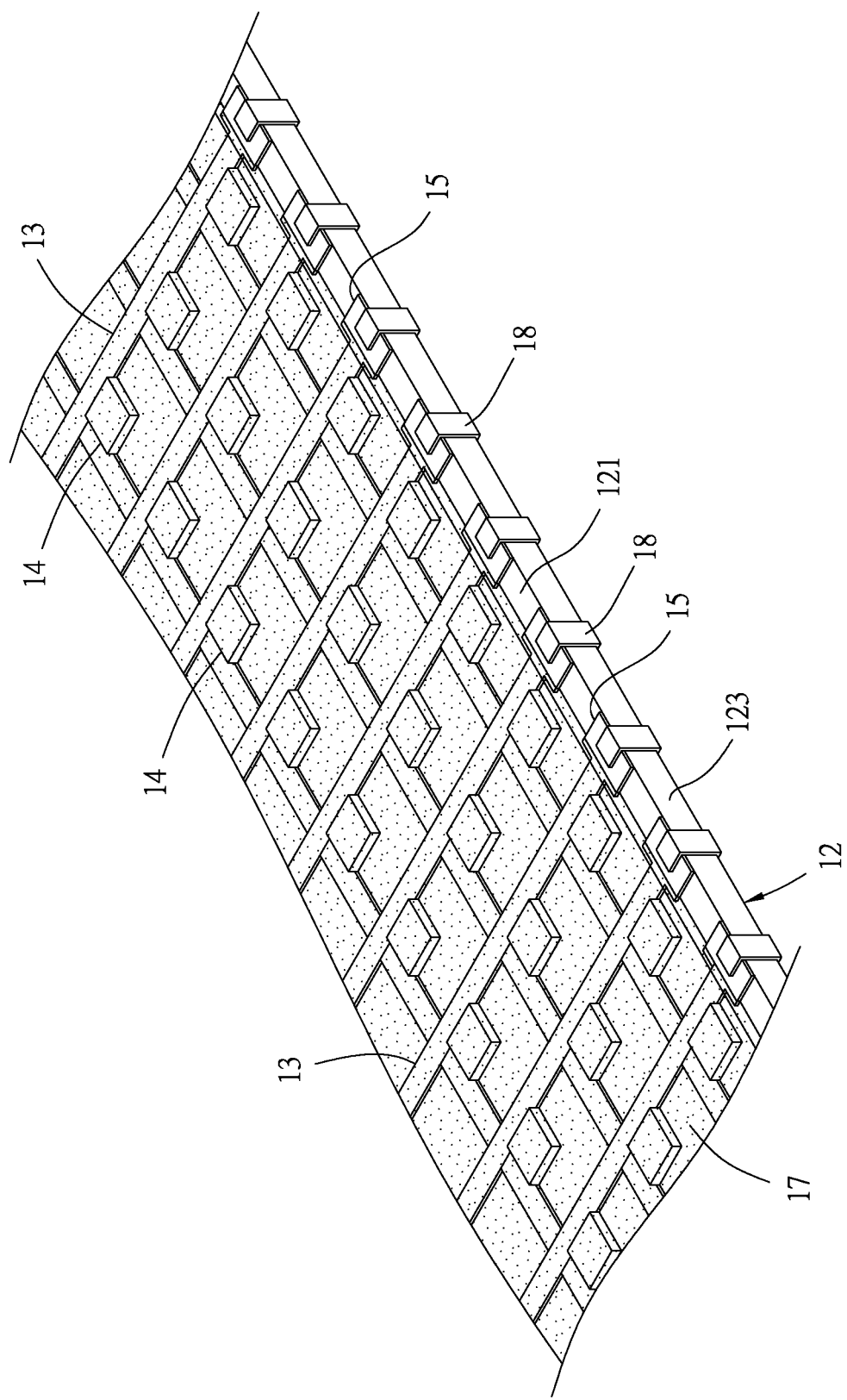
FIG. 8 is a perspective view of a portion of the finished splicing unit according to the first preferred embodiment of the disclosure.
Figure 9:
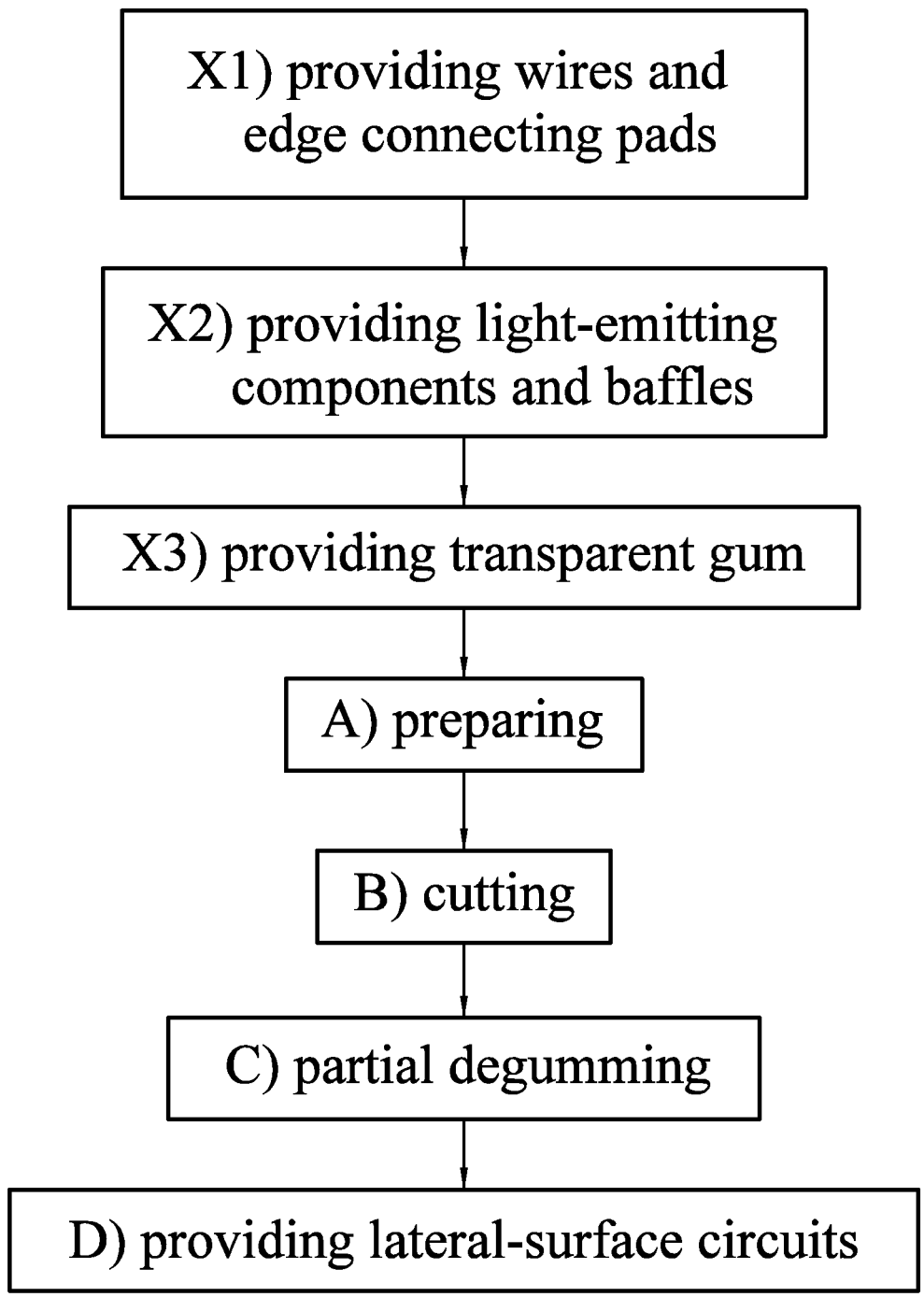
FIG. 9 is a schematic view of a process flow of the method according to the second preferred embodiment of the disclosure.

D) Providing lateral-surface circuits: as shown in FIG. 7 and FIG. 8, a plurality of lateral-surface circuits 18 are provided. The lateral-surface circuits 18 each have one end positioned proximate to the upper surface 121 of the substrate 12 and connected to an exposed portion of a corresponding one of the edge connecting pads 15, a body extending and crossing the side 123 of the substrate 12, and the other end disposed on the lower surface 122 of the substrate 12, so as to attain a finished splicing unit 20. In the first embodiment, the width of the edge connecting pads 15 is greater than the width of the wires 13 to render it easier for the edge connecting pads 15 to connect to the plurality of lateral-surface circuits 18. Furthermore, in the first embodiment, the lateral-surface circuits 18 are each a conducting wire formed by an existing known means, such as impulse printing, side printing, edge sputter, and laser patterning.

The aforesaid steps of the method are effective in attaining the finished splicing unit 20 shown in FIG. 7 and FIG. 8. With the plurality of lateral-surface circuits 18 being disposed on the lower surface 122 of the substrate 12, the finished splicing unit 20 can be connected to any other devices through the plurality of lateral-surface circuits 18 and thereby spliced with another finished splicing unit 20 (not shown).

In the first embodiment, portions of the substrate 12, located at the baffle 16 and outside the baffle 16, are cut off to greatly reduce the width of a non-displaying zone and thereby achieve nearly seamless splicing when the finished splicing unit 20 are spliced with another finished splicing unit 20 (not shown). In this regard, the term "seamless splicing" means seamless image display instead of the absence of gaps between the substrates 12.

For the sake of illustration, the plurality of wires 13 and the plurality of light-emitting components 14 shown in the diagrams are not drawn according to their actual proportions and quantity. In practice, a substrate with known specifications comes in different dimensions. Take a 9.8-inch substrate as an example, it has 193 wires in the X-direction and 216*3 wires in the Y-direction (with 216 being multiplied by a factor of 3 because of RGB LED wires). Since the wires are densely distributed on the substrate and thus difficult to discern and identify, the wires are schematically depicted with diagrams.

Figure 10:
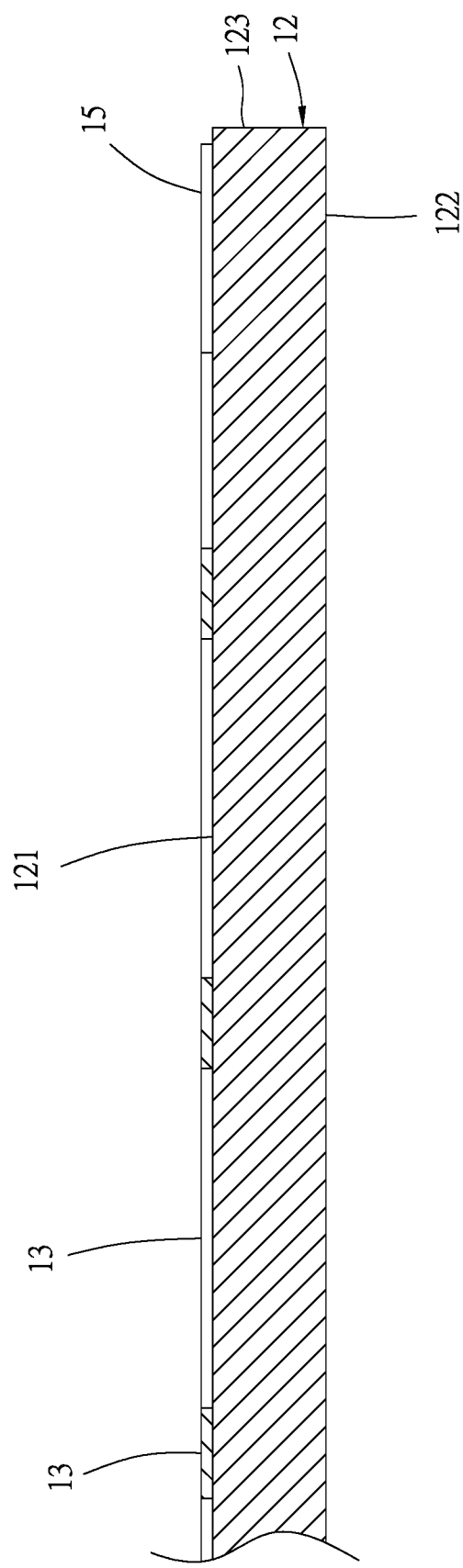
FIG. 10 is a schematic view of how the method works according to the second preferred embodiment of the disclosure.

As shown in FIG. 9 through FIG. 13, the second preferred embodiment of the disclosure provides a method of reducing splicing spacing of an OLED display panel splicing unit, which is distinguished from the method provided in the first preferred embodiment of the disclosure by technical features as follows:

The step A) is preceded by the steps as follows:

X1) Providing wires and edge connecting pads: as shown in FIG. 10, the plurality of wires 13 and the plurality of edge connecting pads 15 are disposed on the substrate 12, with the plurality of wires 13 being connected to the plurality of edge connecting pads 15.

Figure 11:
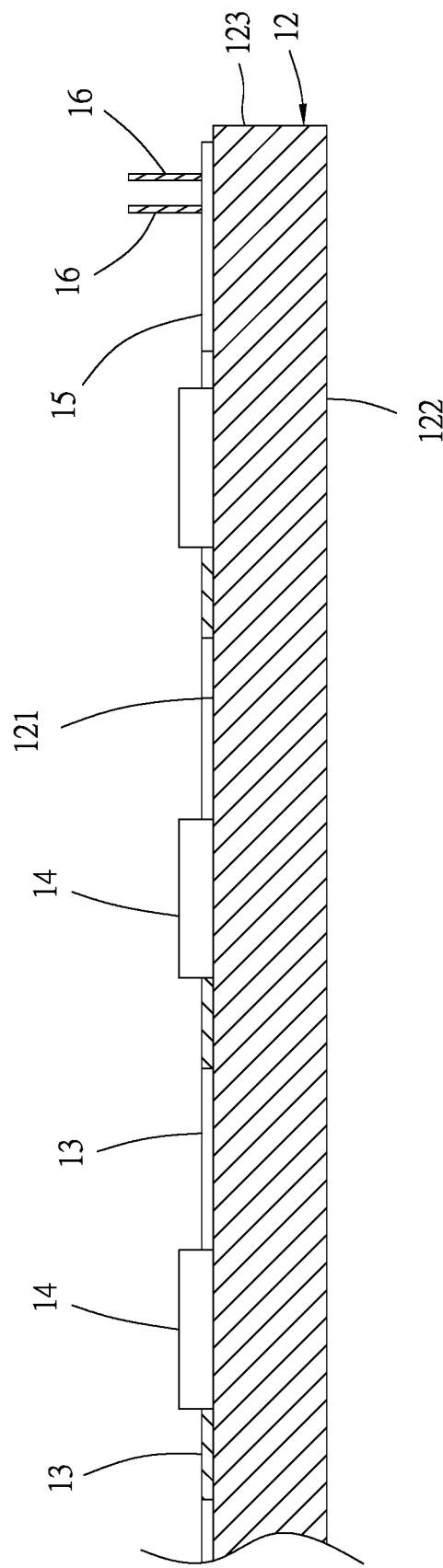
FIG. 11 is another schematic view of how the method works according to the second preferred embodiment of the disclosure.

X2) Providing light-emitting components and baffle: as shown in FIG. 11, the plurality of light-emitting components 14 and the two baffles 16 are disposed on the substrate 12, with the plurality of light-emitting components 14 being connected to the plurality of wires 13, with the at least one baffle 16 being disposed on the plurality of edge connecting pads 15, allowing the plurality of edge connecting pads 15 to be partially exposed on the two sides of the two baffles 16.

Figure 12:
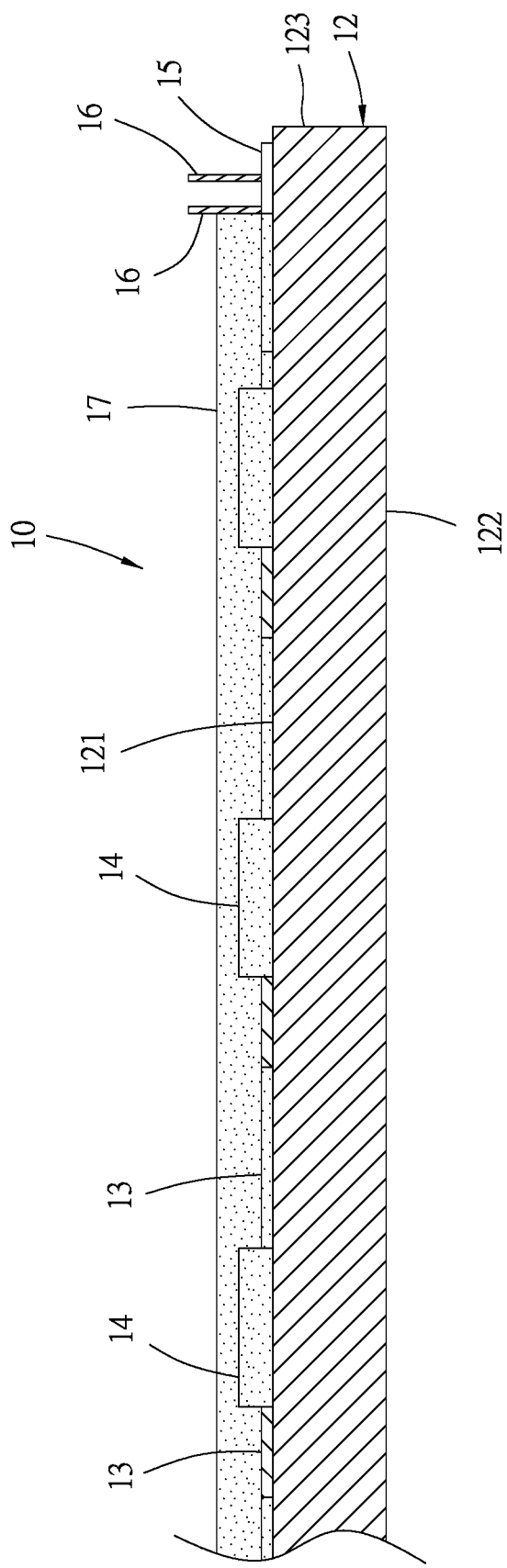
FIG. 12 is a cross-sectional view of the semi-finished splicing unit according to the second preferred embodiment of the disclosure.

X3) Providing transparent gum: as shown in FIG. 12, coating the transparent gum 17 fluidically onto the substrate 12 to cover the plurality of wires 13, the plurality of light-emitting components 14 and a portion of the plurality of edge connecting pads 15 located on one side of the two baffles 16 and exposed, such that the transparent gum 17 is restrained by the two baffles 16 and thus does not fully cover the plurality of edge connecting pads 15.

X4) Curing: curing the transparent gum 17, so as to attain the semi-finished splicing unit 10.

It is noteworthy that the two baffles 16 can be in the number of one and thus may not necessarily in the number of two if the two baffles 16 are sufficient to restrain the overflow of the transparent gum 17.

Figure 13:
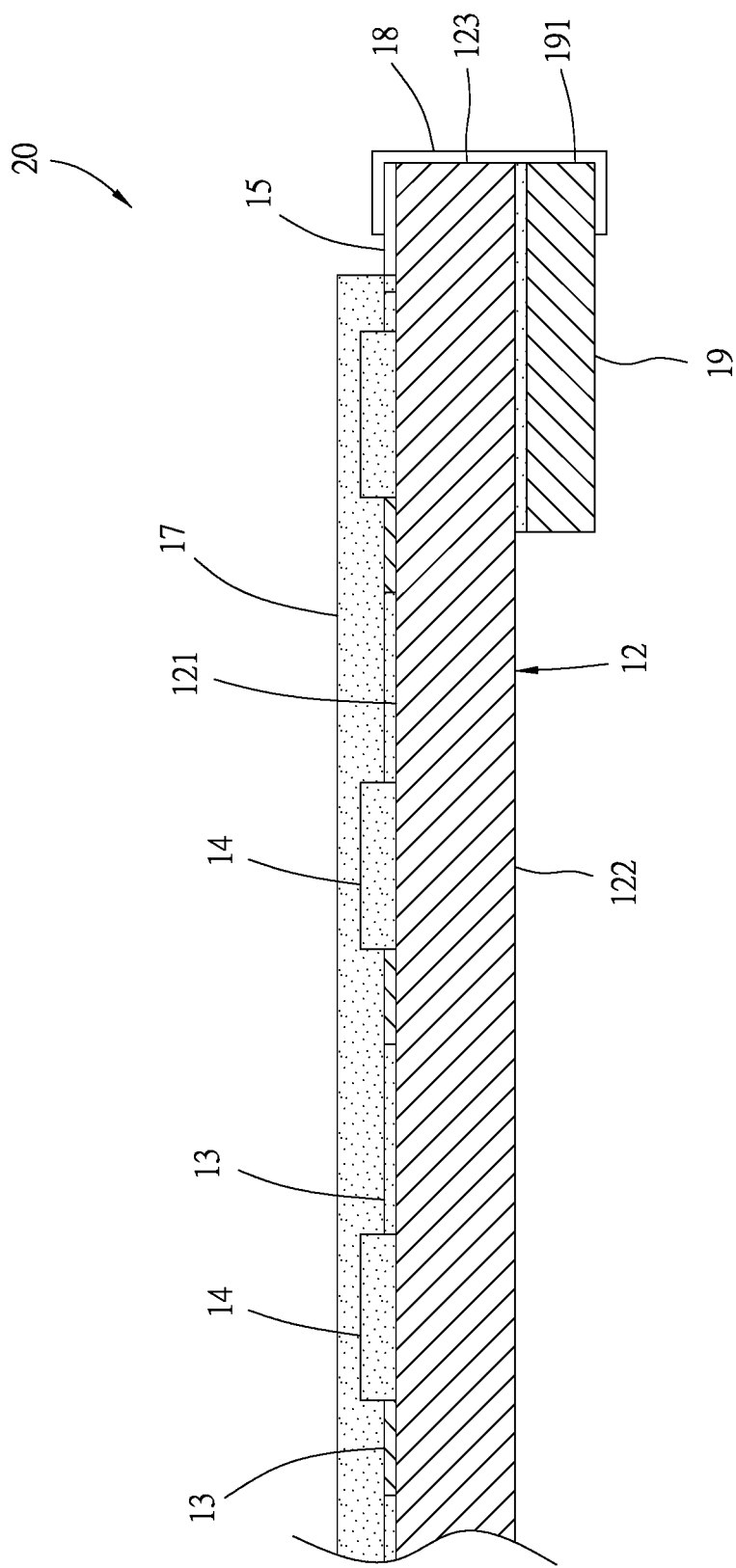
FIG. 13 is a cross-sectional view of the finished splicing unit according to the second preferred embodiment of the disclosure.
Figure 14:
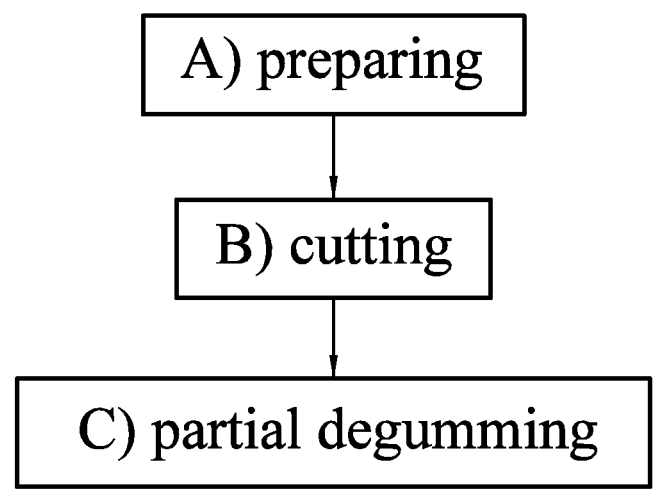
FIG. 14 is a schematic view of a process flow of the method according to the third preferred embodiment of the disclosure.

As shown in FIG. 13, in step D), the lateral-surface circuits 18 each have the other end being not disposed on the lower surface 122 of the substrate 12 but being disposed at the bottom of an external component 19 provided in the form of a connecting board in the second embodiment and attached to the lower surface 122 of the substrate 12, one end positioned proximate to the upper surface 121 of the substrate 12 and connected to an exposed portion of a corresponding one of the edge connecting pads 15, and a body crossing the side 123 of the substrate 12 and a side 191 of the external component 19.

The steps X1)-X4) in the second embodiment are effective in attaining a semi-finished splicing unit 10. The steps A)-D) in the first embodiment are effective in turning the semi-finished splicing unit 10 into a finished splicing unit 20. Thus, an additional technical feature of the second embodiment relative to the first embodiment is a technical means of preparing the semi-finished splicing unit 10.

In the second embodiment, step D) involves providing the external component 19 under the substrate 12, wherein another electronic component, such as a circuit or chip, can be easily disposed on the external component 19 so as to be spliced with another finished splicing unit (not shown).

The other technical features and achievable advantages of the second embodiment are substantially identical to those of the first embodiment and thus are not reiterated herein.

Figure 15:
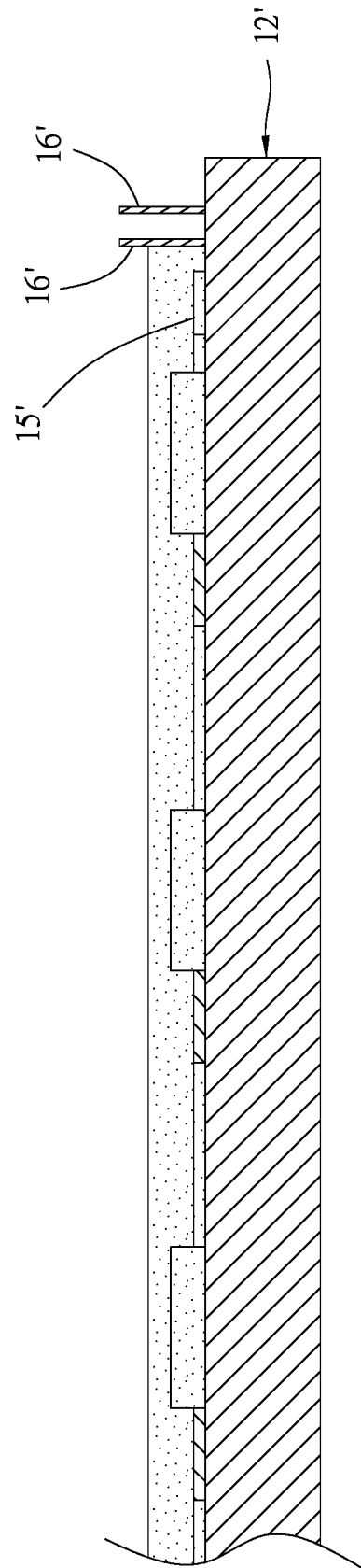
FIG. 15 is a cross-sectional view of the semi-finished splicing unit according to the third preferred embodiment of the disclosure.

As shown in FIG. 14 through FIG. 17, the third preferred embodiment of the disclosure provides a method of reducing splicing spacing of an OLED display panel splicing unit, which is distinguished from the method provided in the first preferred embodiment of the disclosure by technical features as follows:

As shown in FIG. 15, in the step A), the at least one baffle 16' is positioned proximate to an edge of the substrate 12', spaced apart from the edge of the substrate 12' by a predetermined distance, but not disposed on the plurality of edge connecting pads 15'.

Figure 16:
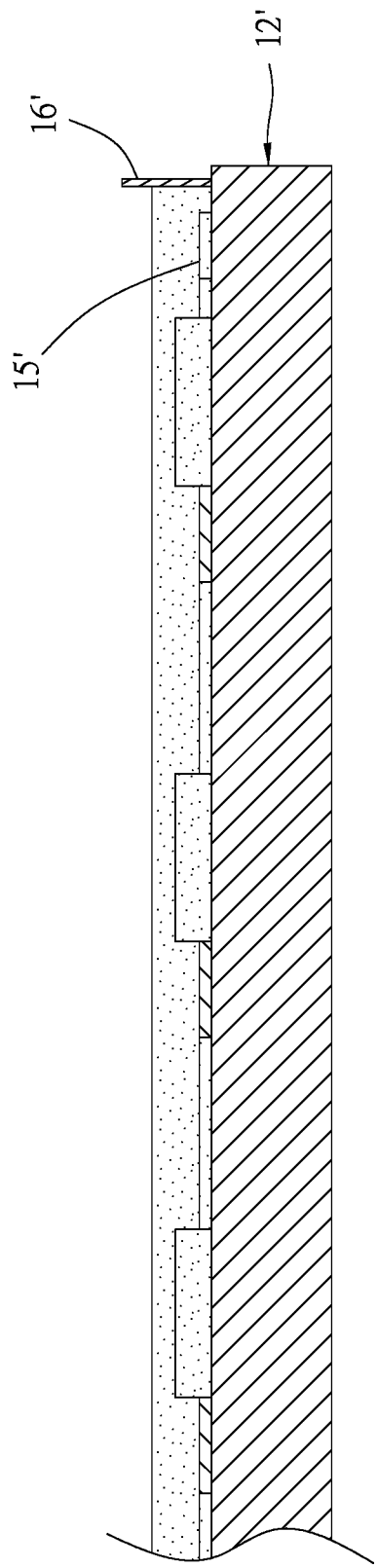
FIG. 16 is a schematic view of how the method works according to the third preferred embodiment of the disclosure.

As shown in FIG. 16, in the step B), the outer baffle 16' is cut off, but the inner baffle 16' is left alone.

Figure 17:
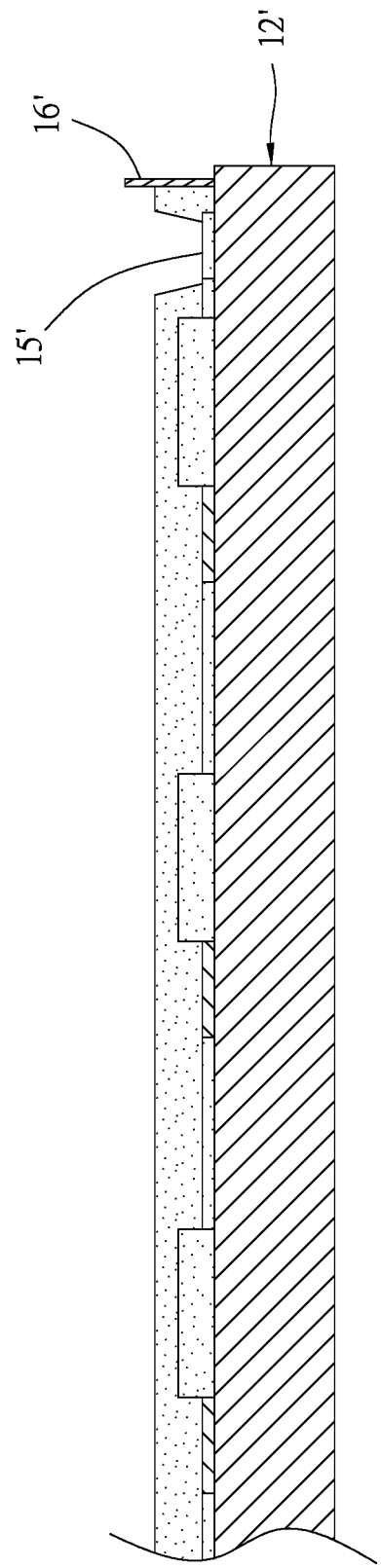
FIG. 17 is a cross-sectional view of the finished splicing unit according to the third preferred embodiment of the disclosure.

As shown in FIG. 17, in the step C), the removed portion of the transparent gum is located on the inner side of the baffle 16', whereas the exposed portions of the plurality of edge connecting pads 15' are connected to external wires (not shown) in order to connect to another component (not shown).

The third embodiment does not have the step D) and thus does not provide lateral-surface circuits.

The third embodiment differs slightly from the first embodiment in terms of the portion cut off. The third embodiment keeps the baffle 16', and thus its cutoff portion is smaller than the cutoff portion of the first embodiment. The third embodiment is conducive to positioning the baffle 16' closer to the plurality of light-emitting components. By contrast, the first embodiment will be the preferred choice if the baffle 16' is positioned distal to the plurality of light-emitting components and thus requires a lager cutoff portion.

The other technical features and achievable advantages of the third embodiment are substantially identical to those of the first embodiment and thus are not reiterated herein.

What is claimed is:

1. A method of reducing splicing spacing of an OLED display panel splicing unit, the method comprising the steps of:
    A) preparing: preparing a semi-finished splicing unit having a substrate, with the substrate being rectangular and having an upper surface, a lower surface and four sides, the upper surface having thereon a plurality of wires, a plurality of light-emitting components, a plurality of edge connecting pads, at least one baffle and a transparent gum, the plurality of light-emitting components being connected to the plurality of wires, the plurality of edge connecting pads being connected to the plurality of wires, and the transparent gum being cured, transparent, and adapted to cover at least a portion of the plurality of edge connecting pads and the plurality of light-emitting components, wherein the at least one baffle is positioned proximate to an edge of the substrate, spaced apart from the edge of the substrate by a predetermined distance, and adapted to be in contact with the transparent gum;
    B) cutting: cutting off a portion of the substrate, wherein the portion cut off at least lies outside the at least one baffle, leaving intact at least the plurality of wires, the plurality of light-emitting components, the plurality of edge connecting pads and the transparent gum on the substrate; and
    C) partial degumming: removing a portion of the transparent gum to allow the plurality of edge connecting pads to be partially exposed and not covered with the transparent gum, so as to attain a finished splicing unit.

2. The method of claim 1, wherein the step A) is preceded by the steps of:
    X1) providing wires and edge connecting pads: providing the plurality of wires and the plurality of edge connecting pads on the substrate, with the plurality of wires being connected to the plurality of edge connecting pads;
    X2) providing light-emitting components and baffle: providing the plurality of light-emitting components and the at least one baffle on the substrate, with the plurality of light-emitting components being connected to the plurality of wires;
    X3) providing transparent gum: coating the transparent gum fluidically onto the substrate to cover the plurality of wires, the plurality of light-emitting components and the plurality of edge connecting pads such that the transparent gum is restrained by the at least one baffle and thus does not fully cover the plurality of edge connecting pads; and
    X4) curing: curing the transparent gum, so as to attain the semi-finished splicing unit.

3. The method of claim 1, wherein, in the step B), the portion cut off further includes a portion of the plurality of edge connecting pads and the at least one baffle, aligning edges of the plurality of edge connecting pads remaining on the substrate with the substrate edge.

4. The method of claim 3, further comprising a step D) of providing lateral-surface circuits: providing a plurality of lateral-surface circuits each having an end positioned proximate to the upper surface of the substrate and connected to an exposed portion of a corresponding one of the edge connecting pads, having a body extending and crossing a side of the substrate, and having another end disposed on the lower surface of the substrate or an external component under the substrate.

5. The method of claim 4, wherein, in the step D), the external component is a connecting board attached to the lower surface of the substrate, and the lateral-surface circuits each have an end positioned proximate to the upper surface of the substrate and connected to an exposed portion of a corresponding one of the edge connecting pads, a body crossing the side of the substrate and a side of the external component, and another end disposed at a bottom of the external component.

6. The method of claim 1, wherein, in the step A), each of the edge connecting pads and the corresponding wire connected thereto are integrally formed.

7. The method of claim 1, wherein cutting is performed with a knife or laser in the step B), and degumming is performed by chemical etching or laser radiation in the step C).

8. The method of claim 1, wherein, in the step A), the at least one baffle is in the number of two.

9. The method of claim 1, wherein, in the step A), wide of the edge connecting pads is greater than width of the wires.

10. The method of claim 1, wherein, in the step B), the cutting is followed by polishing a cutting side of the substrate.

* * * * *